United States Patent [19]

Scherba

[11] 4,128,818
[45] Dec. 5, 1978

[54] ELECTRICAL FREQUENCY RESPONSIVE STRUCTURE

[75] Inventor: Michael B. Scherba, Birmingham, Mich.

[73] Assignee: PYROHM, INC., Farmington Hills, Mich.

[21] Appl. No.: 787,011

[22] Filed: Apr. 13, 1977

[51] Int. Cl.² .......................... H03H 5/08; H01F 5/00; H01F 27/00
[52] U.S. Cl. ..................................... 333/70 S; 333/76; 336/129; 336/220
[58] Field of Search ................. 358/167; 333/76, 70 S; 336/115, 129, 220; 325/379, 380, 383, 376, 377

[56] References Cited

U.S. PATENT DOCUMENTS

| | | | |
|---|---|---|---|
| 1,661,953 | 3/1928 | McIntosh | 336/129 |
| 1,791,236 | 2/1931 | Drake | 333/70 S |
| 2,173,084 | 9/1939 | Case | 336/129 |
| 2,779,924 | 1/1957 | DuChateuier | 325/379 |
| 2,925,495 | 2/1960 | Mason et al. | 336/129 |
| 2,958,930 | 11/1960 | Heazel, Jr. et al. | 336/129 |
| 3,111,636 | 11/1963 | Ma | 333/76 |
| 3,495,201 | 2/1970 | Marker, Jr. | 336/129 |

OTHER PUBLICATIONS

"An Introduction to the Theory & Design of Electric Wavefilters" - F. Scowen 2nd edition, Chapman and Hall, Ltd, 1950, pp. 49-52.
Lafayette Radio Electronics Catalog 700, 1970, p. 392.

*Primary Examiner*—Robert L. Griffin
*Assistant Examiner*—Marc E. Bookbinder
*Attorney, Agent, or Firm*—Whittemore, Hulbert & Belknap

[57] ABSTRACT

An electrical frequency responsive circuit comprising a first relatively larger diameter coil constructed of wire having an insulating coating thereon wound in a single layer about an axis of generation, and a second relatively smaller diameter coil having an outer diameter slightly larger than the inner diameter of the first coil, also constructed of wire having an insulating coating thereon wound about an axis of generation in a single layer. One end of the second coil is screwed into one end of the first coil a distance to provide inductance and capacitance between the coils whereby the circuit is responsive to an electric signal having a predetermined electrical frequency imposed across the other ends of the coils to provide frequency band suppression about the predetermined frequency.

6 Claims, 7 Drawing Figures

ELECTRICAL FREQUENCY RESPONSIVE STRUCTURE

BACKGROUND OF THE INVENTION

1. Field of the Invention

The invention relates to electrical frequency responsive structures, and refers more specifically to a frequency band suppression circuit comprising a pair of coils of slightly different diameter, one of which is screwed into the other to provide a predetermined capacitance and inductance between the coils responsive to a frequency band it is desired to suppress.

2. Description of the Prior Art

In the past, electrical frequency responsive circuits have been used in many fields to reduce interference with the operation of particular equipment by electrical signals of predetermined frequencies. Thus, interference with television reception by citizen band radio operators or amateur radio operators is a problem without frequency responsive structure at the input of the television, such as a frequency band suppression circuit tuned to suppress the particular band of frequencies causing interference, or such as a high frequency pass circuit for suppressing all frequencies below a lower television frequency.

Prior frequency responsive circuits have usually been constructed of separate coils and capacitors soldered together, which have then been connected across a pair of conductors such as the conductors in the usual television cable between the television antenna and receiver. In the simplest case, a frequency band suppression filter circuit is a series connected coil and capacitor tuned to a particular frequency which it is desired to suppress.

Such structure requires the soldering of separate elements, one of which must be variable if the circuit is not pre-tuned. Such filters often become elaborate and therefore expensive.

SUMMARY OF THE INVENTION

In accordance with the invention, an electrical frequency responsive circuit is provided which includes a first coil constructed of a wire having an insulating coating thereon wound in a single layer about an axis of generation having a diameter which is large relative to the diameter of a second coil, and a second coil constructed of wire having an insulating coating thereon wound about an axis of generation, which second coil has an outer diameter slightly larger than the inner diameter of the first coil. The two coils are screwed together with their axis of generation substantially congruent so that one end of the smaller coil extends within one end of the larger coil.

With such arrangement, the inductance and capacitance of the assembled coils is varied by the distance the smaller coil is screwed into the larger coil. The assembled coils provide an electrical frequency band suppression circuit responsive to a frequency which is a function of how far the smaller coil extends into the larger coil. The assembled coils may be placed across the input conductors of a television set and when turned to approximately 27 megahertz will provide frequency band suppression for the usual citizen band radio interference.

A plurality of such electrical frequency responsive circuits may be connected together to provide filters other than frequency band suppression circuits such as high frequency pass circuits, low frequency pass circuits, and frequency band pass circuits. For example, in a configuration wherein three of the frequency responsive circuits of the invention are connected, two of them across the conductors of a television cable and the other in one of the conductors between the other two, a high frequency pass circuit is produced which may be tuned to suppress all frequencies below a lower television frequency of 54 megahertz.

DESCRIPTION OF THE PREFERRED EMBODIMENT

Figure 1:
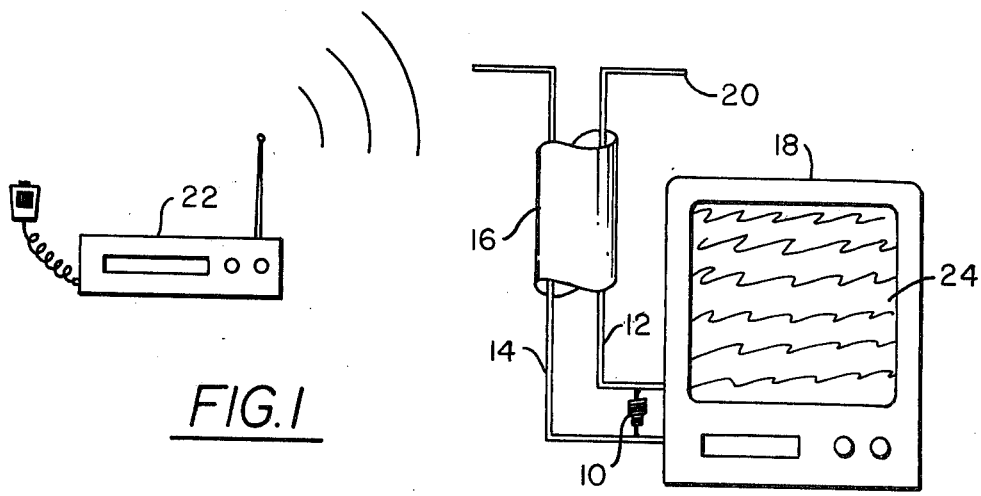
FIG. 1 is a diagrammatic representation of a television receiver interference from a citizen band transmitter, which television set includes an electrical frequency band suppression circuit constructed in accordance with the invention in combination therewith.

As shown in FIG. 1, the electrical frequency responsive circuit 10 is connected across the conductors 12 and 14 in the cable 16 positioned between a television set 18 and the television antenna 20. The circuit 10, as shown in FIG. 1, is tuned to suppress a band of frequencies around 27 megahertz which is the operating frequency of the citizen band radio 22 producing the interference shown on the screen 24 of the television set 18.

Figure 2:
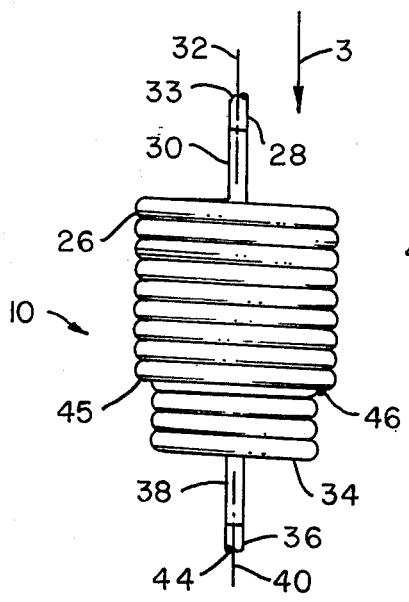
FIG. 2 is an elevation view of an electrical frequency responsive circuit constructed in accordance with the invention.
Figure 3:
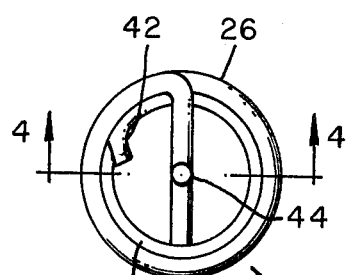
FIG. 3 is an end view of the electrical frequency responsive circuit of FIG. 2, taken in the direction of arrow 3 in FIg. 2.
Figure 4:
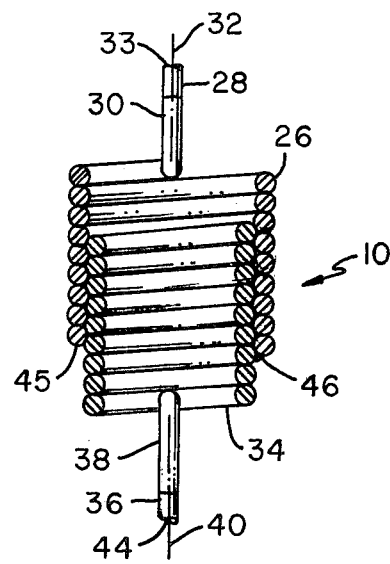
FIG. 4 is a section view of the electrical frequency responsive circuit illustrated in FIGS. 2 and 3, taken substantially on the line 4—4 in FIG. 3.

More particularly, the electrical frequency responsive circuit 10, as shown best in FIGS. 2–4, includes a first coil 26. The coil is constructed of wire 28 which is an electrical conductor and which is coated with an electrical insulating material 30. The coil 26 is then wound about an axis of generation 32 in the configuration shown. The end 33 of the coil 26 is turned radially inwardly and then along the axis of generation 32 of coil 26 as shown.

The electrical frequency responsive circuit 10 further includes a second coil 34 which again is constructed of a wire 36 which is an electrical conductor and which has an electrical insulating coating 38 thereon. The wire 36 is wound in the configuration shown about an axis of generation 40. As shown, the one end 42 of the coil 34 is terminated in a portion extending radially inwardly of the coil 34. The other end 44 of the coil 34 is turned radially inwardly and then along the axis of generation 40 of coil 34 as shown.

In assembly of the electrical frequency responsive circuit 10, the one end 42 of the coil 34, which is constructed to have an outer diameter slightly larger than the inner diameter of the coil 26, is screwed into the one end 45 of the coil 26 as shown best in FIGS. 2 and 4. The coil 34 is screwed into the coil 26 a distance sufficient to provide a desired capacitance and inductance between the ends 33 and 44 of coils 26 and 34, after which the coils may be fixed in such position which may be predetermined by convenient means such as adhesive 46.

The frequency to which the coils 26 and 34 are responsive in assembly with each other is determined by the usual parameters for such coils. Some of the usual parameters for determination of the induction are the material of which the wires are made, the diameter of the wire, the number of turns of the wire, and the proximity and orientation of the coils with respect to each other. In the case of the coils assembled as shown in FIGS. 2-4, some of the parameters for determination of capacitance are the distance the coils are screwed into each other, the composition and thickness of the insulating material on the wire, and the distance between the wore portions of the coils.

In one specific example both coils were approximately 0.4 of an inch long and were constructed of 12 turns of number 20 copper wire having enamel electrical insulation approximately 0.0001 of an inch thick thereon. The larger diameter coil was approximately 0.455 inches in diameter and had an inductance of approximately 1.05 microhenrys. The smaller diameter coil was approximately 0.415 inches in diameter and had an inductance of approximately 0.795 microhenrys. In assembly the coils were adjusted to provide a combined inductance and distributed capacitance resonant at approximately 27 megahertz, whereby a band of frequencies approximately 2 megahertz wide centered at 27 megahertz were suppressed.

Figure 5:
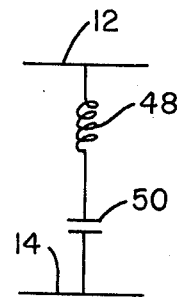
FIG. 5 is an equivalent inductor, capacitance electrical frequency band suppression circuit of the prior art.

The particular electrical frequency responsive circuit illustrated in FIGS. 2-4 is suitable as an electrical frequency band suppression circuit which may be used to suppress citizen band frequencies of approximately 27 megahertz over a 2 megahertz band width. Such a circuit could directly replace the conventional inductor, capacitor suppression circuit shown in FIG. 5.

Figure 6:
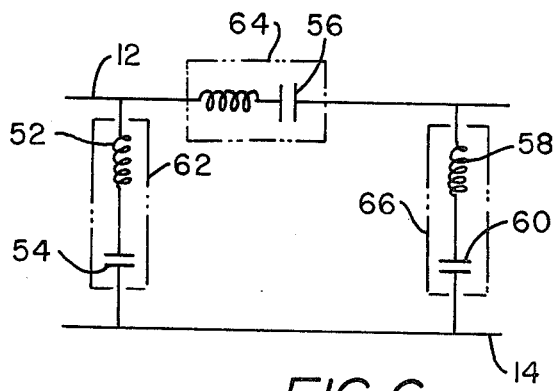
FIG. 6 is a high frequency pass circuit of the prior art.

Three such electrical frequency responsive circuits as shown in FIGS. 2-4 may be utilized in the configuration shown in FIG. 6 to replace the inductor 52 and capacitor 54, the inductance 55 and capacitor 56 and the inductor 58 and capacitor 60, one in place of each of the circuits within the dotted lines 62, 64 and 66. Such a configuration may be tuned to present a high pass filter permitting all frequencies, for example, above 54 megahertz, to pass to a television set, whereby all interfering frequencies below 54 megahertz are suppressed.

While the electrical frequency responsive circuit 10 has been considered in combination with a television set cable and antenna, it will be understood that such an electrical frequency responsive circuit has many other applications. Accordingly, it is not intended to limit the application of the circuit 10. Rather, it is intended to include within the scope of the invention all of the embodiments and modifications of the frequency responsive circuit as are defined by the appended claims.

What I claim as my invention is:

1. An electrical frequency responsive circuit comprising a first electrical coil of relatively large diameter having an axis of generation, a second electrical coil of relatively small diameter having an axis of generation and an end positioned axially at least partly within the first electrical coil, said first coil having an inner diameter slightly smaller than the outer diameter of the second coil, the second coil is screwed into the first coil and insulating material extending between the first and second coils.

2. Structure as set forth in claim 1 wherein the insulating material is provided on the electrical coils.

3. Structure as set forth in claim 1 wherein the end of the second coil which is positioned within the first coil is terminated in a portion extending radially inwardly of the outer diameter of the second coil.

4. Structure as set forth in claim 1 wherein the second coil is screwed into the first coil to provide a predetermined relative position of the coils at which the coils have a predetermined electrical characteristic, and further including means locking the coils in said position.

5. An electrical frequency band suppression circuit comprising a first relatively large diameter electrical coil constructed of wire coated with an electrical insulating material and wound in a single layer about an axis of generation, a second relatively small diameter electrical coil comprising wire coated with an electrical insulating material and wound in a single layer about an axis of generation having an outer diameter slightly larger than the inner diameter of the first coil, said coils having ends screwed together so that the second coil is at least partially within the first coil to provide a distributed capacitance and inductance between the other ends thereof resonant in a band of frequencies it is desired to suppress.

6. an electrical high frequency pass circuit comprising three electrical frequency responsive circuits, two of which are connected across conductors, the frequency response of which it is desired to limit to frequencies above a predetermined frequency, and the third of which is connected in one of the conductors between the other two electrical frequency responsive circuits, each of which electrical frequency responsive circuits comprises a first electrical coil constructed of wire coated with an electrical insulating material and wound in a single layer about an axis of generation having a relatively large diameter, a second electrical coil comprising a wire coated with an electrical insulating material and wound in a single layer about an axis of generation having an outer diameter slightly larger than the inner diameter of the first electrical coil, said coils having ends screwed together so that the second coil is at least partially within the first coil to provide predetermined distributed capacitance and inductance between the other ends of the coils.

* * * * *